(12) United States Patent
Nagai

(10) Patent No.: US 7,977,790 B2
(45) Date of Patent: Jul. 12, 2011

(54) SEMICONDUCTOR DEVICE AND METHOD OF MANUFACTURING THE SAME

(75) Inventor: Noriyuki Nagai, Nara (JP)

(73) Assignee: Panasonic Corporation, Osaka (JP)

( * ) Notice: Subject to any disclaimer, the term of this patent is extended or adjusted under 35 U.S.C. 154(b) by 278 days.

(21) Appl. No.: 12/372,760

(22) Filed: Feb. 18, 2009

(65) Prior Publication Data

US 2009/0212406 A1    Aug. 27, 2009

(30) Foreign Application Priority Data

Feb. 22, 2008  (JP) .................................. 2008-040749

(51) Int. Cl.
*H01L 23/48* (2006.01)
*H01L 23/52* (2006.01)

(52) U.S. Cl. ........ 257/737; 257/773; 257/778; 257/786; 257/E23.021

(58) Field of Classification Search .................. 257/737, 257/778, E23.021, 773, 786
See application file for complete search history.

(56) References Cited

U.S. PATENT DOCUMENTS

| | | | | |
|---|---|---|---|---|
| 5,726,502 | A * | 3/1998 | Beddingfield ................ | 257/797 |
| 6,175,157 | B1 * | 1/2001 | Morifuji ....................... | 257/777 |
| 6,677,677 | B2 * | 1/2004 | Kimura et al. ................ | 257/737 |
| 6,700,208 | B1 | 3/2004 | Yoneda ......................... | 257/779 |
| 6,913,945 | B2 | 7/2005 | Yamauchi et al. ............ | 438/106 |
| 6,965,166 | B2 * | 11/2005 | Hikita et al. .................. | 257/777 |
| 7,129,586 | B2 * | 10/2006 | Kashiwazaki ................ | 257/778 |
| 2002/0185748 | A1 * | 12/2002 | Akram et al. .................. | 257/778 |
| 2004/0047127 | A1 | 3/2004 | Yamauchi et al. ............ | 361/688 |
| 2004/0082107 | A1 | 4/2004 | Shi et al. ........................ | 438/108 |
| 2005/0014313 | A1 | 1/2005 | Workman et al. ............. | 438/127 |
| 2005/0269714 | A1 * | 12/2005 | Akram et al. .................. | 257/778 |
| 2006/0060987 | A1 | 3/2006 | Chen et al. ..................... | 257/787 |
| 2008/0179738 | A1 * | 7/2008 | Nishimura et al. ........... | 257/737 |
| 2008/0217768 | A1 * | 9/2008 | Miranda et al. ............... | 257/737 |
| 2009/0153765 | A1 | 6/2009 | Yamashita et al. ............. | 349/58 |

FOREIGN PATENT DOCUMENTS

| | | |
|---|---|---|
| JP | 11-233544 | 8/1999 |
| JP | 2001-127198 | 5/2001 |
| JP | 2002-203874 | 7/2002 |
| JP | 2004-221320 | 8/2004 |
| JP | 2007-059703 | 3/2007 |
| JP | 2007/039959 | 4/2007 |
| JP | 2007-096096 | 4/2007 |

* cited by examiner

*Primary Examiner* — Nitin Parekh
(74) *Attorney, Agent, or Firm* — Steptoe & Johnson LLP

(57) ABSTRACT

When manufacturing a semiconductor device by mounting a semiconductor chip 2 on a substrate 1 with a flip-chip method, projections 9 are formed between pads 4 arranged in multiple annular concentric layers on the semiconductor chip 2 other than pads 4 arranged along the innermost periphery thereof. On the substrate 1, bonding resin 3 is dispensed onto an area inside the innermost periphery along which the pads 4 are arranged. By heating and applying pressure, the bonding resin 3 is spread over the entire gap between the substrate 1 and the semiconductor chip 2 so as to secure the substrate 1 to the semiconductor chip 2 by the bonding resin 3, thereby preventing a void from being formed in an area outside the innermost periphery along which the pads 4 are arranged and thus stabilizing an electrical connection state between the semiconductor chip 2 and the substrate 1.

19 Claims, 5 Drawing Sheets

SEMICONDUCTOR DEVICE AND METHOD OF MANUFACTURING THE SAME

TECHNICAL FIELD

The present invention relates to a semiconductor device in which a semiconductor chip is mounted on a substrate by using a flip-chip method, and a method of manufacturing the semiconductor device.

BACKGROUND ART

In various types of electronic devices, a semiconductor device mounted on the mother substrate of the electronic device includes a substrate, a semiconductor chip disposed on the top surface of the substrate, and bonding resin interposed between the bottom surface of the semiconductor chip and the top surface of the substrate.

Furthermore, on the top surface of the substrate, connection terminals are intermittently arranged in multiple annular concentric layers along inner and outer peripheries of the substrate. Similarly, on the bottom surface of the semiconductor chip, pads are intermittently arranged in multiple annular concentric layers along inner and outer peripheries of the semiconductor chip.

Moreover, the connection terminals intermittently arranged in multiple annular concentric layers along the inner and outer peripheries of the substrate are connected to the pads intermittently arranged in multiple annular concentric layers along the inner and outer peripheries of the semiconductor chip via bumps, respectively.

After connecting the bumps, the bonding resin is injected into a gap between the substrate and the semiconductor chip by using a capillary action that facilitates the bonding resin to spread through the gap from the outside to the inside of the semiconductor chip, so as to fill the gap with the bonding resin, thereby securing the bottom surface of the semiconductor chip to the top surface of the substrate.

SUMMARY OF THE INVENTION

Disadvantageously, in the conventional semiconductor device, an electrical connection state between the semiconductor chip and the substrate becomes unstable.

Specifically, in the conventional semiconductor device, after connecting the bumps, the bonding resin is injected into the gap between the substrate and the semiconductor chip by using a capillary action that facilitates the bonding resin to spread through the gap from the outside to the inside of the semiconductor chip, so as to fill the gap with the bonding resin, thereby securing the bottom surface of the semiconductor chip to the top surface of the substrate. However, due to the so-called entrainment of air, avoid is formed in an area where the bonding resin does not flow smoothly.

Such an area having a void may deform due to thermal processing to be executed thereafter. If the area having a void deforms, the fastening of the semiconductor chip to the substrate by the bonding resin becomes unstable. Accordingly, the electrical connection state between the semiconductor chip and the substrate also becomes unstable.

In view of the above, in the conventional semiconductor device having the bumps intermittently arranged on the top surface of the substrate in multiple annular concentric layers, projections are provided between only the bumps intermittently arranged along the inner periphery of the substrate, thereby suppressing void formation.

However, as a method of manufacturing the semiconductor device, it is necessary to add another step of forming the projections, thereby leading to an increased cost. Furthermore, because an adhesive strength is lowest on the boundary surface of the semiconductor chip and a resin material, it is difficult to prevent a void from being formed on the boundary surface, hence causing the electrical connection state between the semiconductor chip and the substrate to become unstable.

In order to solve the problem mentioned above, an object of the present invention is to stabilize the electrical connection state between the semiconductor chip and the substrate while suppressing an increase in the number of manufacturing steps.

In order to attain the object mentioned above, a semiconductor device of the present invention in which a semiconductor chip is mounted on a substrate by using a flip-chip method, the semiconductor device comprising: a plurality of groups of pads arranged in multiple annular concentric layers along the periphery of the semiconductor chip; projections formed between the plurality of groups of pads; a plurality of connection terminals formed on the substrate so as to be connected to the pads on the semiconductor chip via bumps, respectively; and an adhesive for securing the substrate to the semiconductor chip, wherein the projections are formed between the pads other than the pads arranged along the innermost periphery of the semiconductor chip, and a space is provided between the substrate and each of the projections.

Furthermore, the plurality of groups of pads are arranged in a staggered manner.

Furthermore, each of the projections is divided by at least one slit extending in a direction parallel to facing surfaces of the pads adjacent to each other.

Furthermore, each of the projections has a trapezoidally-shaped cross section so as to be tapered toward the substrate.

Furthermore, each of the projections has a recessed portion on the top surface thereof.

Furthermore, a corrugated portion is formed in the vicinity of a region, on the surface of the semiconductor chip, in which each of the projections is formed.

Furthermore, the surface of the semiconductor chip having the corrugated portion is a surface protection layer.

Furthermore, the corrugated portion is formed by disposing a dummy metal in the lower layer of the surface of the semiconductor chip.

Furthermore, a method of manufacturing a semiconductor device is a method of manufacturing the above-described semiconductor device, the method comprising the steps of, in forming resin: dispensing the adhesive in the central region of the substrate, on which the semiconductor chip is to be mounted; and connecting the semiconductor chip to the substrate by application of heat and pressure such that the pads are connected to the connection terminals via the bumps, respectively, wherein the adhesive flows over the bottom of the semiconductor chip from the center to the periphery thereof.

Furthermore, the semiconductor chip includes a protection layer disposed on a surface inside a region in which the pads are formed, and the projections are formed at a time when the protection layer is formed.

DESCRIPTION OF THE PREFERRED EMBODIMENTS

Hereinafter, a semiconductor device of the present invention will be described with reference to FIG. 1 to FIG. 9.

Figure 1:
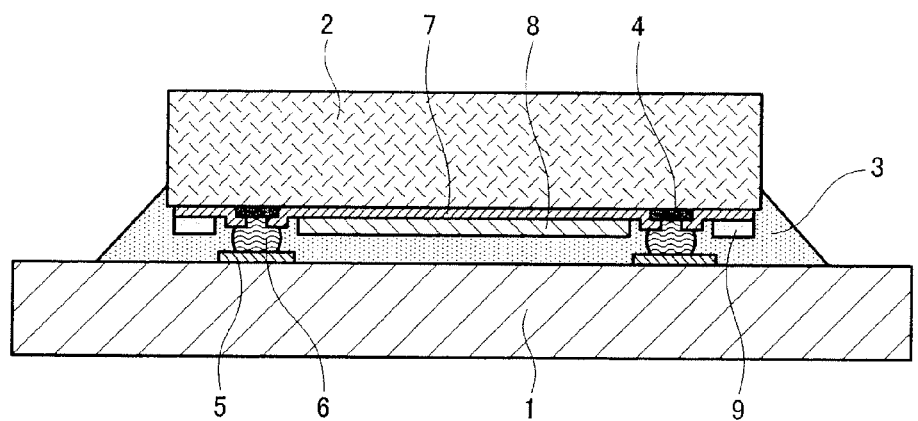
FIG. 1 is a cross-sectional view illustrating a semiconductor device of the present invention.
Figure 2:
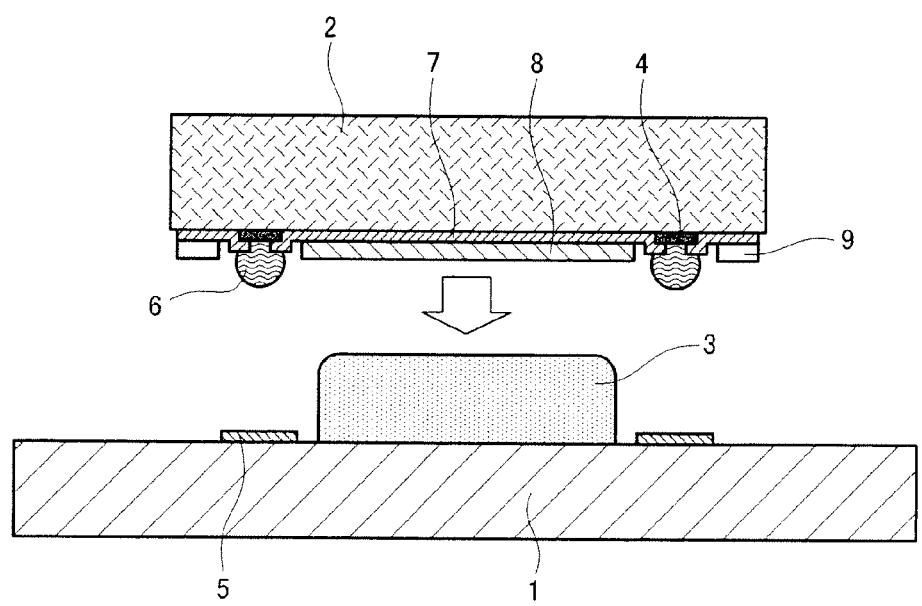
FIG. 2 is a cross-sectional view describing the step of interposing bonding resin used in the semiconductor device of the present invention.
Figure 3:
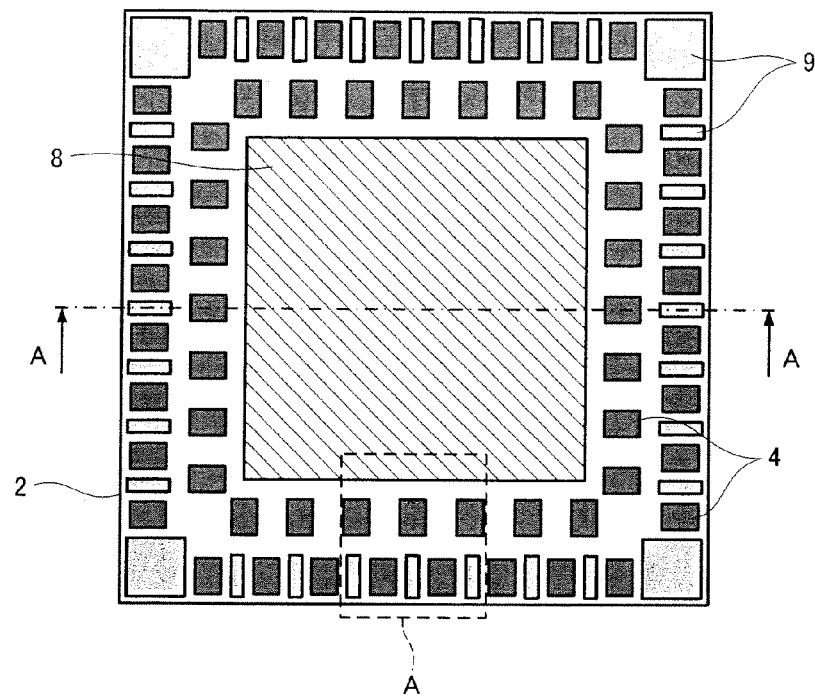
FIG. 3 is a bottom surface view illustrating a semiconductor chip included in the semiconductor device of the present invention.
Figure 4:
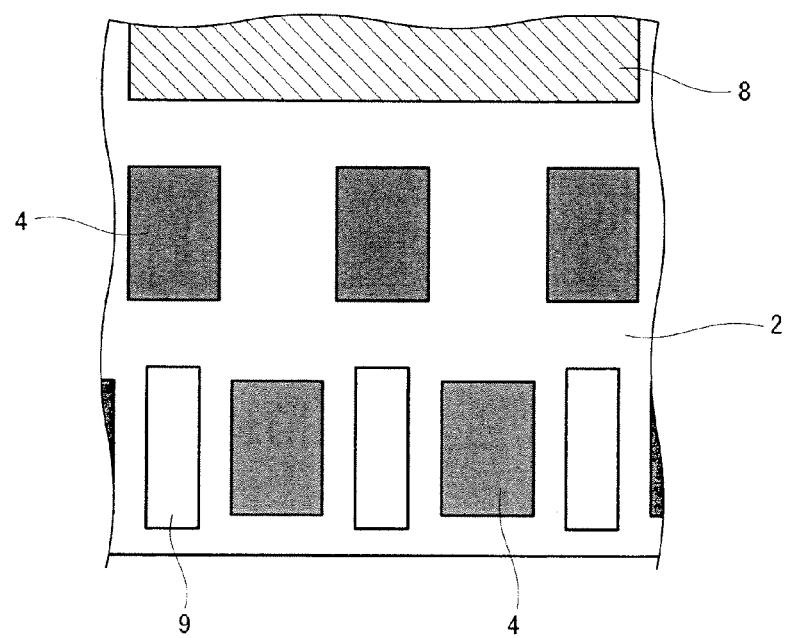
FIG. 4 is an enlarged view illustrating a principal portion of the semiconductor chip included in the semiconductor device of the present invention.
Figure 5:
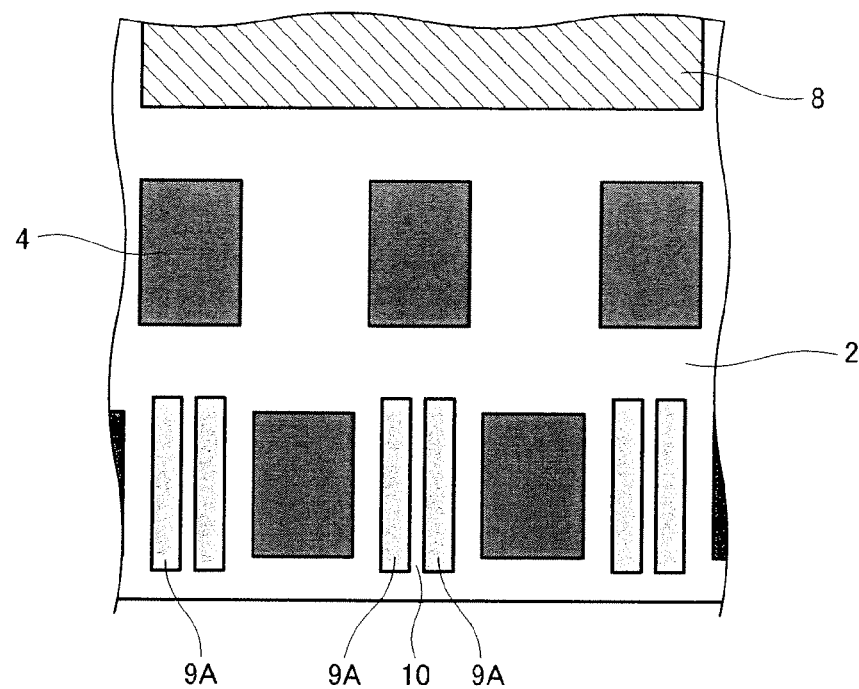
FIG. 5 is an enlarged view illustrating the principal portion of the semiconductor chip including projections disposed in rows of two or more.
Figure 6:
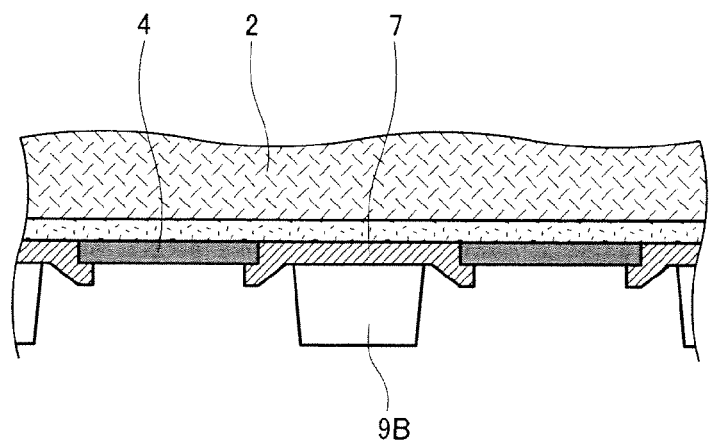
FIG. 6 is a cross-sectional view illustrating a trapezoidal prism-shaped projection.
Figure 7:
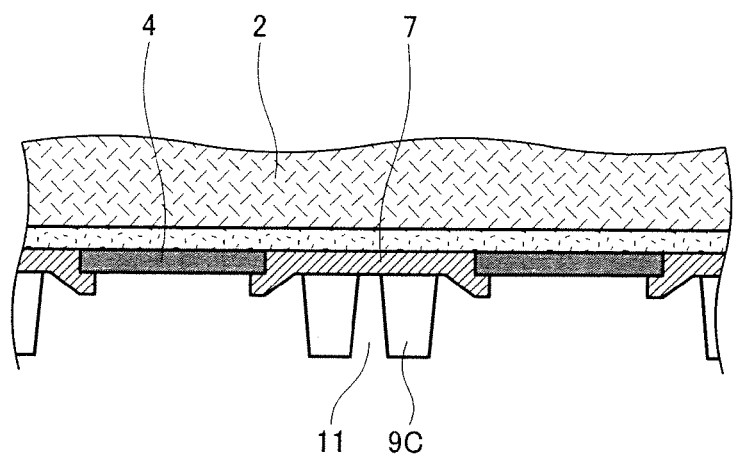
FIG. 7 is across-sectional view illustrating trapezoidal prism-shaped projections disposed in rows of two or more.
Figure 8:
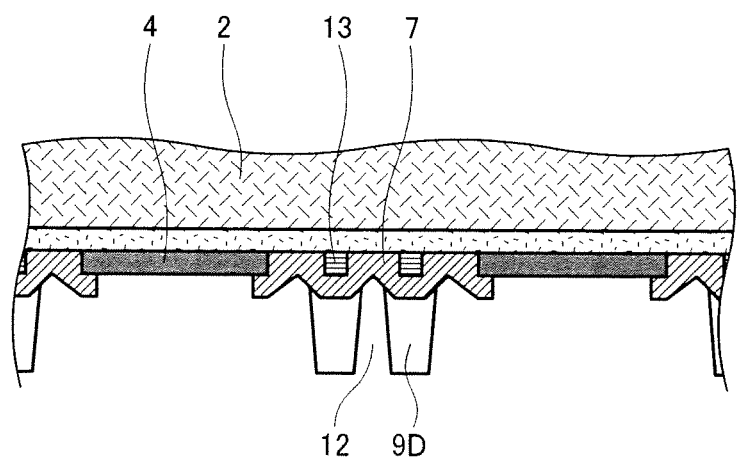
FIG. 8 is a cross-sectional view illustrating projections, each having a corrugated bottom portion formed on a surface protection layer.
Figure 9:
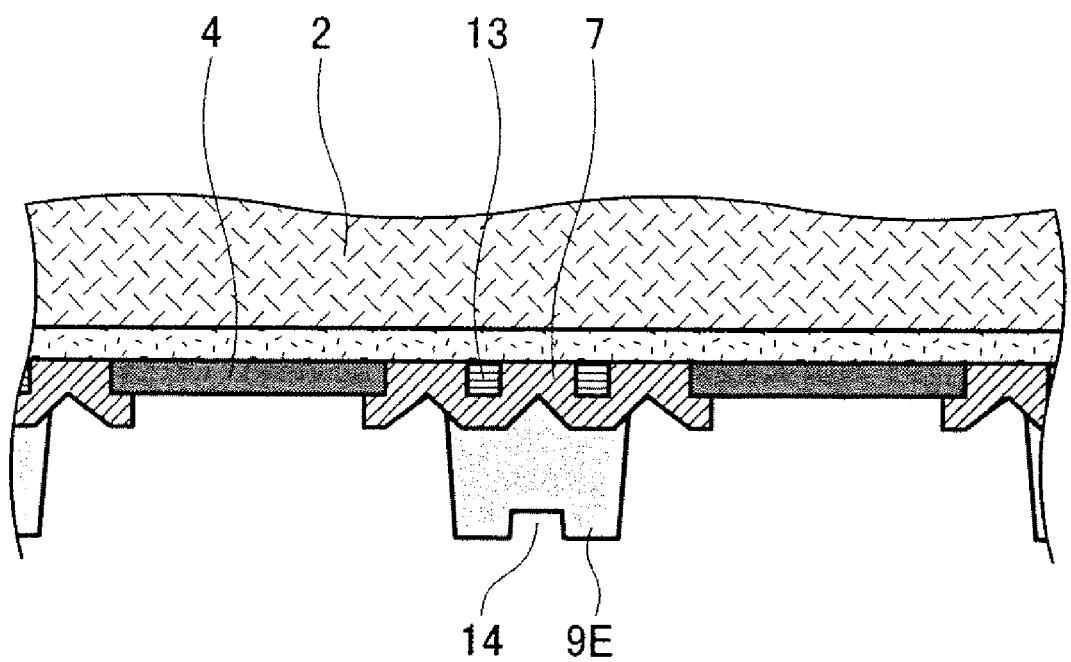
FIG. 9 is across-sectional view illustrating a projection in which a recessed portion is formed on the top surface of the projection.

FIG. 1 is a cross-sectional view taken from dashed-dotted line A-A of FIG. 3, illustrating a semiconductor device according to the present invention. FIG. 2 is a cross-sectional view describing the step of interposing bonding resin used in the semiconductor device of the present invention, and FIG. 3 is a bottom surface view of a semiconductor chip included in the semiconductor device of the present invention. In FIG. 3, a surface protection layer 7 is not shown. FIG. 4 is an enlarged view illustrating a principal portion (i.e., an area A enclosed by a dashed line in FIG. 3) of the semiconductor chip included in the semiconductor device of the present invention. In FIG. 4, arrangements of pads and projections are shown. FIG. 5 is an enlarged view illustrating the above principal portion including projections disposed in rows of two or more, FIG. 6 is a cross-sectional view illustrating a projection having a trapezoidal prism shape, FIG. 7 is a cross-sectional view illustrating trapezoidal prism-shaped projections disposed in rows of two or more, FIG. 8 is a cross-sectional view illustrating projections each having a corrugated bottom portion formed on a surface protection layer, and FIG. 9 is a cross-sectional view illustrating a projection in which a recessed portion is formed on the top surface of the projection.

As shown in FIG. 1, the semiconductor device of the present invention includes a substrate 1, a semiconductor chip 2 disposed on the top surface of the substrate 1, and bonding resin 3 for bonding the semiconductor chip 2 and the substrate 1 together, the bonding resin being interposed between the bottom surface of the semiconductor chip 2 and the top surface of the substrate 1.

On the bottom surface of the semiconductor chip 2, as shown in FIG. 3, pads 4 are intermittently arranged in multiple annular concentric layers along inner and outer peripheries of the semiconductor chip 2 (hereinafter, referred to as "inner pads 4" or "outer pads 4", if necessary). Furthermore, on the top surface of the substrate 1, connection terminals 5 are also intermittently arranged in multiple annular concentric layers along inner and outer peripheries of the substrate 1 so as to be connected to the pads 4, respectively.

The connection terminals 5 are electrically connected to the pads 4 via bumps 6, respectively.

Furthermore, on the bottom surface of the semiconductor chip 2, a portion inside a region in which the pads 4 are formed and a portion surrounding each pad 4 are covered with a surface protection layer 7. Also, as shown in FIG. 1 and FIG. 3, a protection layer 8 covers a portion of the surface protection layer 7 covering the portion inside the region in which the pads 4 are formed.

As shown in FIG. 1, the thickness of the protection layer 8 is greater than that of each pad 4, protruding substantially farther toward the substrate 1.

When the protection layer 8 is formed, projections 9 shown in FIG. 3 and FIG. 4 are also formed on the bottom surface of the semiconductor chip 2.

More specifically, the projections 9 are formed on the bottom surface of the semiconductor chip 2 between the bumps 6 intermittently arranged in an annular manner along the outer periphery of the semiconductor chip 2 (hereinafter, referred to as "outer bumps 6", if necessary, and the bumps 6 intermittently arranged along the inner periphery may be referred to as "inner bumps 6", if necessary). Each of the projections 9 protrudes farther downward toward the substrate 1 than each pad 4, but protrudes less than each bump 6.

When manufacturing such a semiconductor device according to the present invention by mounting, on the substrate 1, the semiconductor chip 2 in which the projections 9 are formed on the bottom surface thereof, polyimide resin as the bonding resin 3, for example, is firstly dispensed onto the substrate 1, as shown in FIG. 2, and then the semiconductor chip 2 is pressed against the substrate 1 while applying heat and pressure to the semiconductor chip 2, thereby softening the polyimide resin so as to be spread outwardly toward the perimeter of the substrate 1. As such, the bonding resin 3 is filled between the semiconductor chip 2 and the substrate 1.

As a result, the polyimide resin firstly exudes between the inner bumps 6 intermittently arranged in an annular manner and then exudes between the outer bumps 6. Finally, the polyimide resin spreads over to the perimeter of the semiconductor chip 2, as shown in FIG. 1.

The bumps 6 are connected to the connection terminals 5, respectively, in the following manner. In one case, the polyimide resin is dispensed first onto the substrate 1, and then pressure is applied when mounting, on the substrate 1, the semiconductor chip 2 having the bumps formed thereon by using a flip-chip method. Thereafter, the connections between the bumps 6 and the connection terminals 5 are maintained by heat shrinkage of the polyimide resin. In another case, profile conditions are set so as to cause resin flow almost simultaneously when the bumps are melted, whereby the connections between the bumps 6 and the connection terminals 5 are maintained by hardening the resin at the same time as hardening the bumps.

In the present invention, the bumps 6 are consecutively arranged in multiple annular concentric layers, i.e., arranged in a staggered manner, along the inner and outer peripheries of the semiconductor chip 2. Therefore, the polyimide resin having exuded between the inner bumps 6 is to exude between the outer bumps 6, flowing around each inner bump 6 to envelop each inner bump.

In this case, the polyimide resin having exuded between the inner bumps 6 flows around each inner bump 6 to envelop each inner bump, thereby entraining air in an area outside each inner bump 6 and thus a void is easily generated.

In order to solve the problem mentioned above, in the present invention, each of the projections 9 is formed in a region between the outer pads 4 so as to protrude toward the inner pads 4, and an edge surface of each of the projections 9, facing toward the center of the semiconductor chip 2, is closer to the center of the semiconductor chip 2 than an edge of the region between the outer pads 4. Furthermore, the projections 9 are formed at a time when the protection layer 8 is formed, and thus no special step is additionally required to form the projections 9. The projections 9 allow the bonding resin 3 to more easily flow around the outer bumps 6. Therefore, no void is generated by entraining air. Thus, it becomes possible to stabilize an electrical connection status between the semiconductor chip 2 and the substrate 1 while suppressing an increase in the number of manufacturing steps. In the present invention, each of the projections 9 is formed in a portion serving as an area where an entrained void is most likely to be generated, in which the difference between the height of an inner area of the semiconductor chip on the top surface of the substrate and the height of each pad is small, thereby making it possible to further suppress the void formation as compared with the conventional art.

Furthermore, each of the projections 9 protrudes toward the substrate 1, which is disposed therebelow, and protrudes farther than each pad 4 but less than each bump 6. Therefore, the projections 9 do not interfere with the electrical connections between the bumps 6 and the connection terminals 5, and also do not interfere with a flow of the polyimide resin spreading outwardly toward the periphery of the semiconductor chip 2.

The polyimide resin having spread beyond the perimeter of the semiconductor chip 2 in such a manner as described above is then thermally hardened so as to become the bonding resin 3 as shown in FIG. 1.

FIG. 5 is a view showing another embodiment of the present invention. In this embodiment, projections 9A are formed in rows of two or more. The projections 9A are divided by at least one slit 10, thereby allowing the polyimide resin to flow more smoothly. As a result, after the polyimide resin is hardened, the semiconductor chip is more firmly secured to the substrate 1 because the polyimide resin adheres to the slit 10.

FIG. 6 is a view showing still another embodiment of the present invention. In this embodiment, a trapezoidally-shaped projection 9B is formed. It is easy to form the projection 9B into a trapezoidal prism shape, and because the area of the top surface of the projection 9B is smaller than that of the top surface of the projection 9, the polyimide resin flows more smoothly.

FIG. 7 is a view showing still another embodiment of the present invention. In this embodiment, a projection 9C has the combined structure of the projection 9A shown in FIG. 5 and the projection 9B shown in FIG. 6. Specifically, the trapezoidal prism-shaped projection 9C having a slit 11 is formed. It is easy to form the projection 9C into a trapezoidal prism shape, and because the area of the top surface of the projection 9C is smaller than that of the top surface of the projection 9, the polyimide resin flows more smoothly. Furthermore, the slit 11 allows the polyimide resin to flow more smoothly. As a result, after the polyimide resin is hardened, the semiconductor chip 2 is more firmly secured to the substrate 1 because the polyimide resin adheres to the slit 11.

FIG. 8 is a view showing still another embodiment of the present invention. In this embodiment, a trapezoidal prism-shaped projection 9D having a slit 12 is formed. It is easy to form the projection 9D into a trapezoidal prism shape, and because the area of the top surface of the projection 9D is smaller than that of the top surface of the projection 9, the polyimide resin flows more smoothly. Furthermore, the slit 12 allows the polyimide resin to flow more smoothly. As a result, after the polyimide resin is hardened, the semiconductor chip 2 is more firmly secured to the substrate 1 because the polyimide resin adheres to the slit 12. Furthermore, in the present embodiment, at a time when the pads 4 are formed, a dummy metal 13 is also provided in a portion of the bottom surface of the semiconductor chip 2 on which the projection 9D is to be formed, thereby forming a corrugated portion on the surface of the surface protection layer 7, the surface including the bottom of the slit 12, and thus the polyimide resin adheres to the bottom of the slit 12 more easily. In the present embodiment, the corrugated portion is formed on the surface protection layer 7. However, the present invention is not limited thereto. The corrugated portion may be formed on a surface of any material on which the projection 9D is to be formed. Furthermore, in the present embodiment, the dummy metal is provided to form the corrugated portion. However, any method of forming the corrugated portion may be used.

Furthermore, FIG. 9 is a view showing still another embodiment of the present invention. In this embodiment, a recessed portion 14 is formed on the top surface of a projection 9E having a trapezoidal prism shape. Because the area of the top surface of the trapezoidal prism-shaped projection 9E is smaller than that of the top surface of the projection 9, the polyimide resin flows more smoothly. The recessed portion 14 allows the semiconductor chip 2 to be more firmly secured to the substrate 1 after the polyimide resin is hardened, because the polyimide resin adheres to the recessed portion 14. FIG. 9 shows an exemplary structure in which a corrugated portion is formed on the surface protection layer 7. However, the corrugated portion is not necessarily provided. Furthermore, the shape of the projection is not limited to a trapezoidal prism shape. The projection may have a rectangular prism shape. Also, the projection may be divided into a plurality of projections by slits.

The above embodiments illustrate an example where the pads are intermittently arranged in two annular concentric layers along the inner and outer peripheries of the semiconductor chip 2. However, the number of layers may be three or more. In this case, the projections are formed between the pads other than the pads arranged along the innermost periphery of the semiconductor chip 2, whereby no voids will be generated by entraining the air. Thus, it becomes possible to stabilize an electrical connection status between the semiconductor chip 2 and the substrate 1.

Note that in the semiconductor devices shown in FIG. 1 to FIG. 9, the substrate 1 is mounted on the mother substrate (not shown) of an electronic device.

What is claimed is:

1. A semiconductor device comprising:
   a semiconductor chip;
   a plurality of groups of pads arranged along a periphery of the semiconductor chip, the plurality of groups of pads being electrically connected to a plurality of connection terminals formed on a substrate, on which the semiconductor chip is mounted via an adhesive; and
   projections formed between the pads and on the semiconductor chip;
   wherein
   the projections are formed between pads other than the pads arranged along an innermost periphery of the semiconductor chip, and a corrugated portion is formed in a vicinity of a region, in which each of the projections is formed.

2. The semiconductor device according to claim 1, wherein the plurality of groups of pads are arranged in a staggered manner.

3. The semiconductor device according to claim 1, wherein each of the projections is divided by at least one slit extending in a direction parallel to facing surfaces of the pads adjacent to each other.

4. The semiconductor device according to claim 1, wherein each of the projections has a trapezoidally-shaped cross section so as to be tapered toward the substrate.

5. The semiconductor device according to claim 1, wherein each of the projections has a recessed portion on a top surface thereof.

6. The semiconductor device according to claim 1, wherein the surface of the semiconductor chip having the corrugated portion is a surface protection layer.

7. The semiconductor device according to claim 1, wherein the corrugated portion is formed by disposing a dummy metal in a lower layer of the surface of the semiconductor chip.

8. The semiconductor device according to claim 1, wherein the plurality of groups of pads have a first group of pads and a second group of pads, the first group of pads are surrounded by the second group of pads, and the projections are not formed between the pads arranged in the first group of pads.

9. A semiconductor device comprising:
a semiconductor chip;
a plurality of groups of pads arranged along a periphery of the semiconductor chip, the plurality of groups of pads being electrically connected to a plurality of connection terminals formed on a substrate, on which the semiconductor chip is mounted via an adhesive;
projections formed between the pads on the semiconductor chip; wherein
a dummy metal is formed in a vicinity of a region, in which each of the projections is formed, and wherein the plurality of groups of pads have a first group of pads and a second group of pads, the first group of pads are surrounded by the second group of pads, and the projections are not formed between the pads arranged in the first group of pads.

10. The semiconductor device according to claim 9, wherein the plurality of groups of pads are arranged in a staggered manner.

11. The semiconductor device according to claim 9, wherein each of the projections is divided by at least one slit extending in a direction parallel to facing surfaces of the pads adjacent to each other.

12. The semiconductor device according to claim 9, wherein each of the projections has a trapezoidally-shaped cross section so as to be tapered toward the substrate.

13. The semiconductor device according to claim 9, wherein each of the projections has a recessed portion on a top surface thereof.

14. A semiconductor device comprising:
a semiconductor chip;
a plurality of groups of pads arranged along a periphery of the semiconductor chip, the plurality of groups of pads being electrically connected to a plurality of connection terminals formed on a substrate, on which the semiconductor chip is mounted via an adhesive; and
projections are formed between the pads and on the semiconductor chip;
wherein the plurality of groups of pads include a first group of pads and a second group of pads,
the first group of pads is surrounded by the second group of pads, and
the projections are not formed between the pads in the first group of pads.

15. The semiconductor device according to claim 14, wherein the plurality of groups of pads are arranged in a staggered manner.

16. The semiconductor device according to claim 14, wherein
each of the projections is divided by at least one slit extending in a direction parallel to facing surfaces of the pads adjacent to each other.

17. The semiconductor device according to claim 14, wherein
each of the projections has a trapezoidally-shaped cross section so as to be tapered toward the substrate.

18. The semiconductor device according to claim 14, wherein each of the projections has a recessed portion on a top surface thereof.

19. The semiconductor device according to claim 14, wherein
a dummy metal is formed in a vicinity of a region, in which each of the projections is formed.

* * * * *